United States Patent [19]

Inoue et al.

[11] Patent Number: 5,371,750

[45] Date of Patent: Dec. 6, 1994

[54] ERROR-CORRECTION ENCODING AND DECODING SYSTEM

[75] Inventors: Tohru Inoue; Hideo Yoshida, both of Kanagawa, Japan

[73] Assignee: Mitsubishi Denki Kabushiki Kaisha, Tokyo, Japan

[21] Appl. No.: 773,651

[22] PCT Filed: Feb. 28, 1991

[86] PCT No.: PCT/JP91/00266

§ 371 Date: Oct. 10, 1991

§ 102(e) Date: Oct. 10, 1991

[87] PCT Pub. No.: WO91/13496

PCT Pub. Date: Sep. 5, 1991

[30] Foreign Application Priority Data

Mar. 2, 1990 [JP] Japan .................. 2-51111
Apr. 25, 1990 [JP] Japan .................. 2-109864

[51] Int. Cl.$^5$ ...................... G06F 11/10; H03M 13/00
[52] U.S. Cl. ................................................ 371/37.4
[58] Field of Search ............... 371/37.1, 37.4, 38.1, 371/39.1, 40.1, 40.3

[56] References Cited

U.S. PATENT DOCUMENTS 4,665,537 5/1987 Moriyama ..................... 371/39
5,070,503 12/1991 Shikakura ..................... 371/37.1

FOREIGN PATENT DOCUMENTS 41514 4/1981 Japan .
185124 7/1988 Japan .
185125 7/1988 Japan .
2180966 4/1987 United Kingdom .

OTHER PUBLICATIONS

Kasahara et al., "New Classes of Binary Codes Constructed on the Basis of Concatenated Codes and Product Codes" IEEE Trans. on Information Theory, vol. IT-22, No. 4, Jul. 1976.

Primary Examiner—Robert W. Beausoliel, Jr.
Assistant Examiner—Stephen C. Elmore
Attorney, Agent, or Firm—Wolf, Greenfield & Sacks

[57] ABSTRACT

An error-correction encoding and decoding system. First information of $k_1 \times k_2$ digits with $k_1$ digits in a first direction and $k_2$ digits in a second direction is encoded to a product code $C_A$ of $n_1 \times n_2$ digits by a partial code word $C_1$ encoded in the first direction to a linear ($n_1$, $k_1$, $d_1$) code with the minimum distance $d_1$ and a partial code word $C_2$ encoded in the second direction to a linear ($n_2$, $k_2$, $d_2$) code with the minimum distance $d_2$. A code $U_s$, which is obtained by encoding the second information of $r \times k_x$ ($r < n_1 - k_1$, $k_x < n_2$) digits to a linear ($n_2$, $k_x$, $d_3$) code of the minimum distance $d_3$ in the second direction, is superimposed on a check symbol field of the product code $C_A$ to generate an error-correcting code $C_z$, thereby obtaining tile first and second information from an error-correcting code $C_z$.

6 Claims, 13 Drawing Sheets

Fig. 1
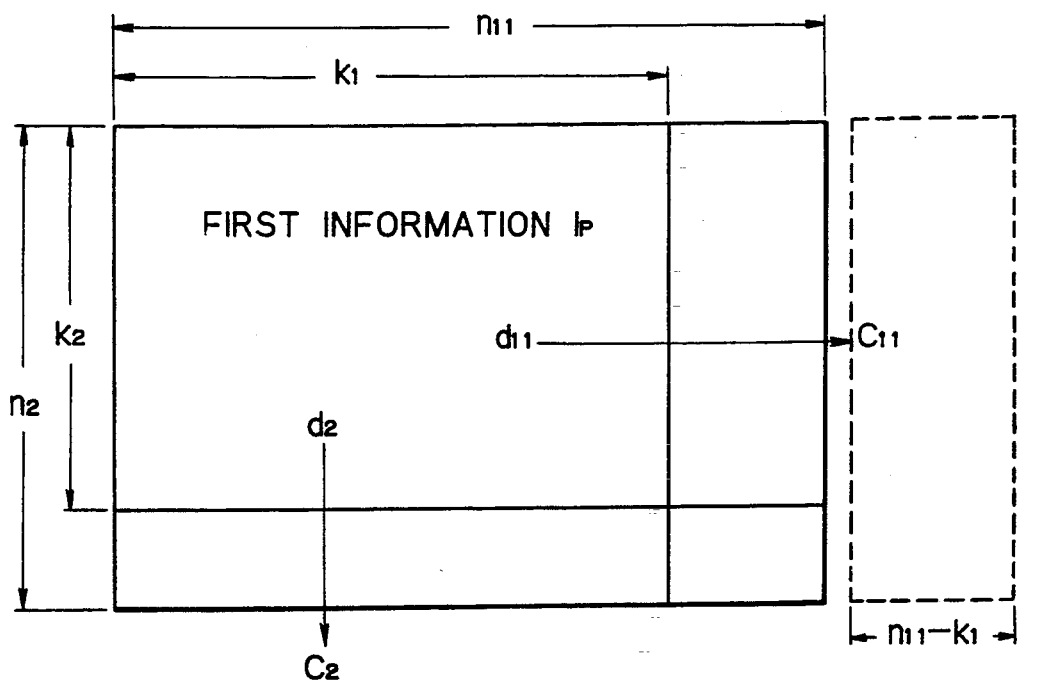
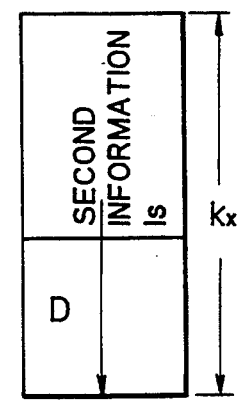

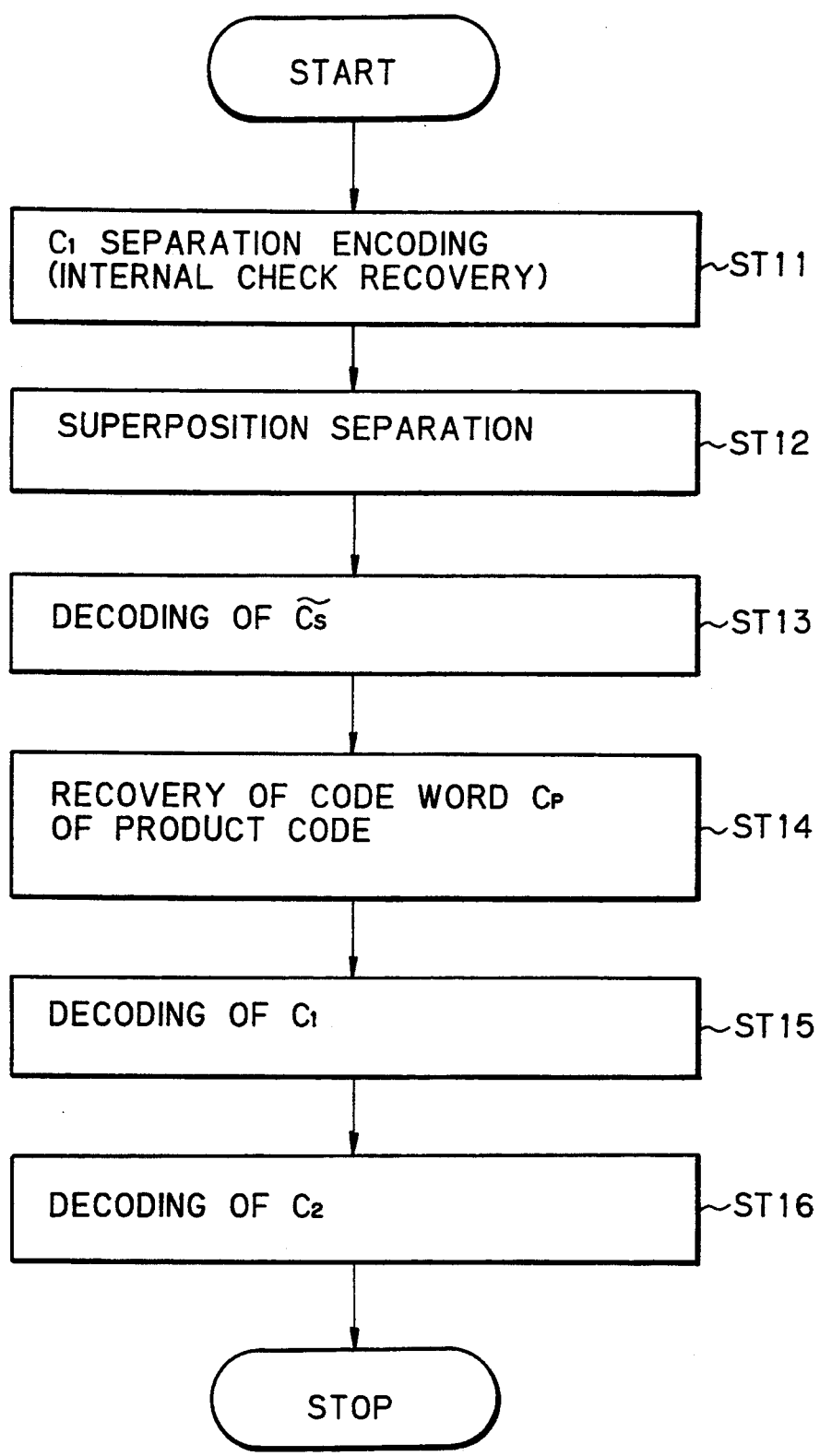

RECEIVED WORD $\tilde{C}_y$

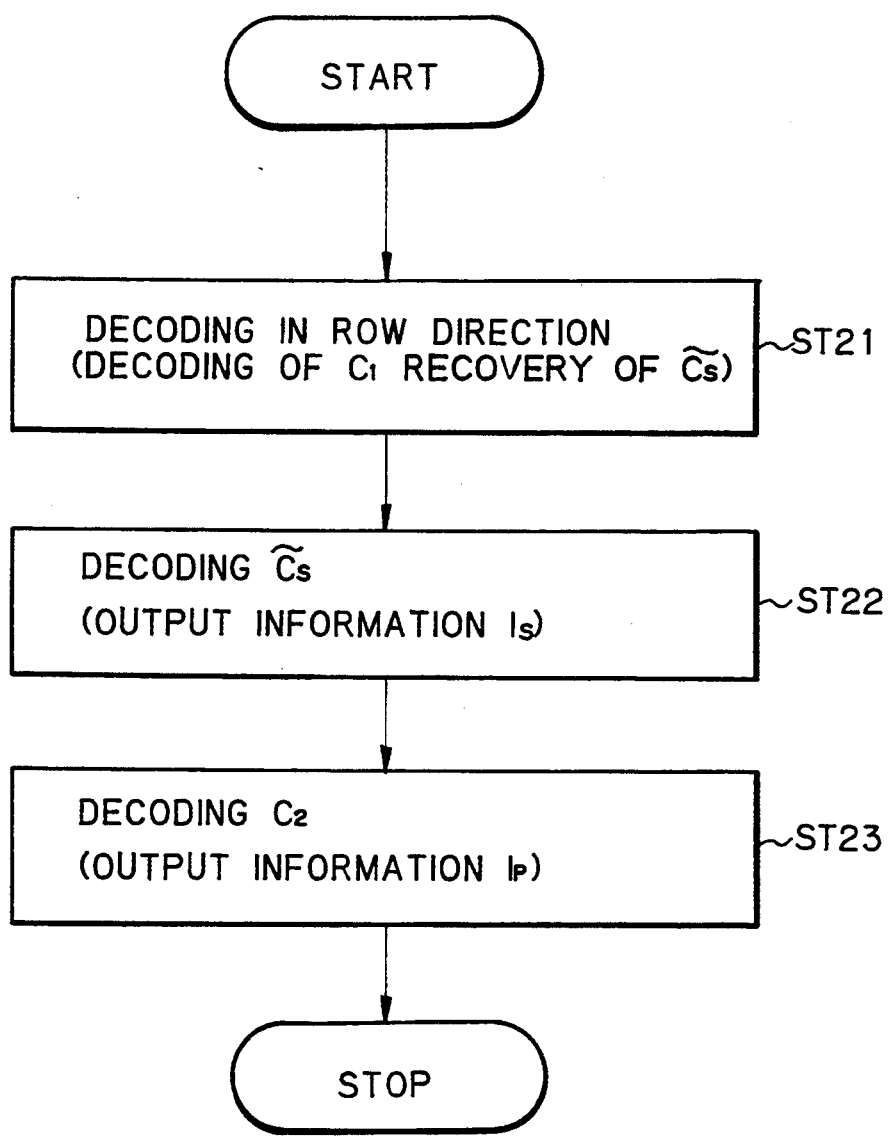

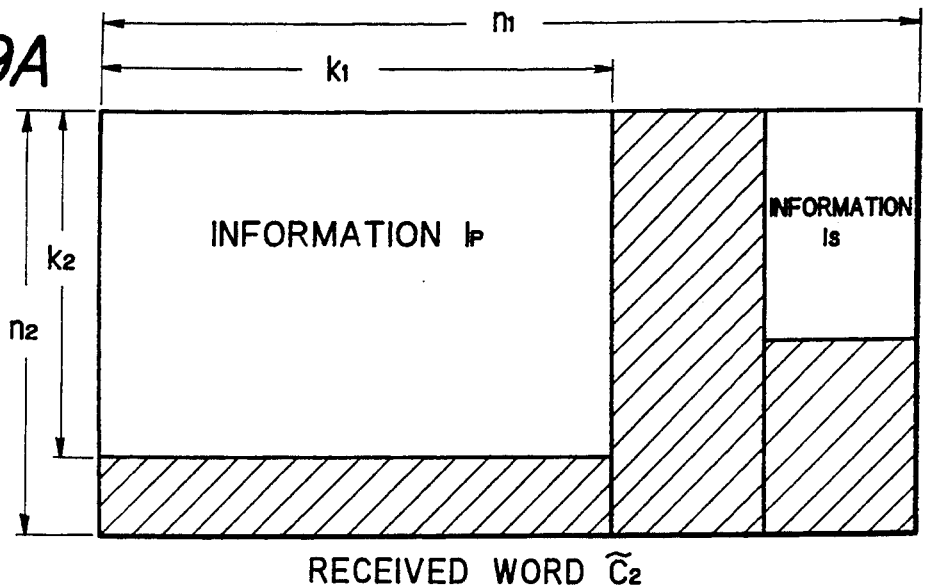
Fig. 9A
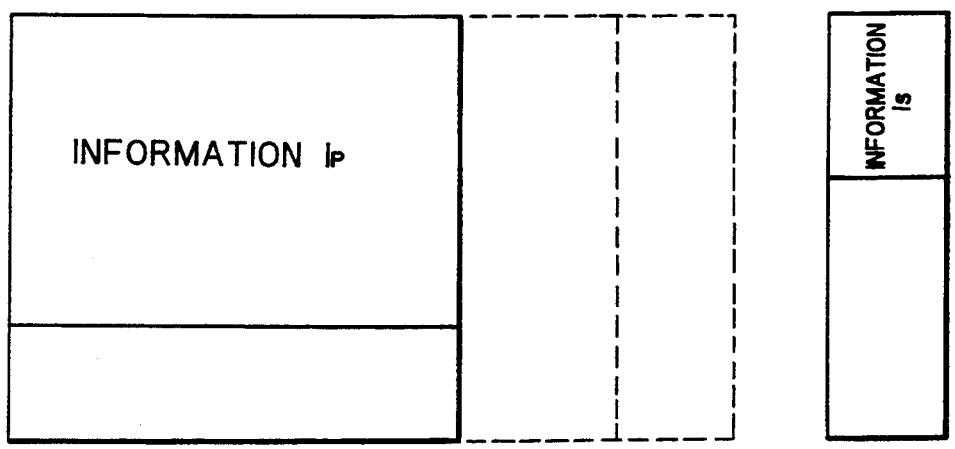
Fig. 9B
Fig. 9D
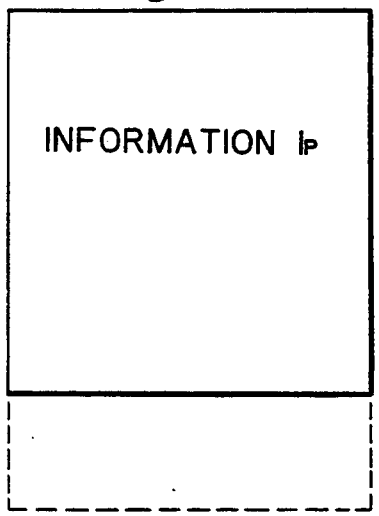
Fig. 9C
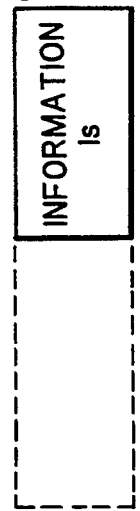

ERROR-CORRECTION ENCODING AND DECODING SYSTEM

BACKGROUND OF THE INVENTION

1. Field of the Invention

The present invention relates to an encoder and a decoder for realizing an error-correction encoding and decoding system for processing an error-correcting code, the code being made by superimposing error-correcting codes respectively generated from a couple of pieces of information and a decoding system utilizing such a decoder.

2. Discussion of Related Art

FIG. 1 shows an example of a code format utilizing a product code, i.e., first information $I_p$, which is required to be highly reliable, and second information $I_s$, which is not required to have such a high reliability. See Peterson et al., *Error-Correcting Codes* p. 131-136 (MIT Press, 1972). As shown in FIG. 1, first information $I_p$ of $k_1 \times k_2$ digits is encoded by a product code. Namely, this first information $I_p$ is encoded to a product code, having as a partial code, a linear code $C_{11}$ having a code word length $n_{11}$, information code length $k_1$, and minimum code length $d_{11}$ (hereinafter a linear code of code word length N, information code length K, and minimum code length D will be called a (N, K, D) linear code C). First information $I_p$ also has $(n_2, k_2, d_2)$ linear code $C_2$ as a partial code. The composite minimum distance is $d_{11} \cdot d_2$.

On the other hand, second information $I_s$ of $r \times k_x$ digits $(r < n_{11} - k_1)$ is encoded to a block code, e.g., a $(n_2, k_x, D)$ linear code $C_3$ on a Galois field $GF(2^r)$. In this case, the product code and linear code $C_3$ are not superimposed with each other and are transmitted separately.

FIG. 2 shows an example of a code format for encoding first information $I_p$ and second information $I_s$ using a superimposed code, introduced, for example, by M. Kasahara, et al., "New Classes of Binary Codes Constructed on the Basis of Concatenated Codes and Product Codes," IEEE Transaction on Information Theory, Vol, IT -22, No. 4, p. 462–468 (July 1976). In this case, first information $I_p$ is encoded to a product code of the compound minimum distance $d_1 \cdot d_2$ by using the partial codes $(n_1, k_1, d_1)$ linear code $C_1$ and $(n_2, k_2, d_2)$ linear code $C_2$. Second information $I_s$ of $(n_1 - k_1) \times (n_2 - (d_1 \cdot d_2 - 1))$ digits is encoded by an RS (Reed-Solomon) code on $GF(2^r)$ of the minimum distance $d_1 \cdot d_2 - 1$. Here, $r = n_1 - k_1$ and a code word $C_s$ of the RS code is superimposed on a check field $C_h$ (hatched portion in FIG. 2) of the product code.

Next, an encoding operation will be explained. First information $I_p$ is encoded to a product code, while second information $I_s$ is encoded to an $(n_2, n_2 - d_1 \cdot d_2 + 1, d_1 \cdot d_2 - 1)$ RS code on $GF(2^r)$. A code word of the product code is $C_p$ and a code word of the RS code is $C_s$. Code word $C_s$ is superimposed on code check field $C_h$ ($C_h$ is assumed to include a check field of linear code $C_1$ and an internal check field for this check field). After such superimposing the resulting code word $C_y$ is transmitted to a transmission line.

Here, the i-th symbol $R_i$ of code word $C_s$ is expressed as $R_i = (R_{i1}, R_{i2}, \ldots, R_{ir})$, and $M_i$ is defined as follows:

$$M_i = H_i \oplus R_i$$
$$= H_{i1} \oplus R_{i1}, H_{i2} \oplus R_{i2}, \ldots, H_{ir} \oplus R_i)$$

$\oplus$ means modulo-2 sum and $H_i$ designates a symbol of check field $C_h$. Moreover, $F_i$ is defined as follows:

$$F_i = (I_i, M_i)$$

$I_i$ is an information symbol of linear code $C_1$. Therefore, code word $C_y$ may be expressed as a vector $(F_1, F_2, \ldots, F_q)$ where $q = n_2$.

In addition, the article in the IEEE journal, cited above, provides the following theorem:

Theorem: If a product code is capable of correcting up to t errors a code after the superimposing can correct errors when the minimum distance $D_1$ satisfies the relationship $t = [(D_1 - 1)/2$.

Next, a decoding operation will be explained. Here, re-encoding a received information symbol series is called "separation encoding." Further, recovering the internal check by separation encoding is called "internal check recovery," while separation of a superimposed received word by modulo-2 sum of an internal check symbol and a received word is called "superimposing separation." An error newly added to a superimposed code word at the time of superimposing separation due to an error generated at the information symbol of the basic code is called a "pseudo-error." This pseudo-error coincides with a syndrome.

A detailed explanation will be made with reference to a flowchart of FIG. 3 and an explanatory drawing of FIG. 4. A received word $\tilde{C}_y$ is shown in FIG. 4(a). In this figure, the hatched area indicates a redundant field. First, as shown in FIG. 4(b), separation encoding is carried out for each of the $n_2$ lines in a $C_1$ separation-encoding routine (step ST11) to obtain an internal check recovery symbol $\tilde{H}_i$. Next, in a superimposing separation routine (step ST12), as shown in FIG. 4(c), internal check recovery symbol $\tilde{H}_i$ is modulo-2 summed with a check field $\tilde{M}_i$ of received word $\tilde{C}_y$ in order to separate a received word $\tilde{C}_s$ of the superimposed code. In a superimposed code decoding routine (step ST13), received word $\tilde{C}_s$ is decoded to obtain a decoded word $\overline{C}_s$ and information $I_s$ is output as shown in FIG. 4(d).

Moreover, a received word $\tilde{C}_p$ of the product code is separated in a product code recovery routine (step ST14) by modulo-2 summing decoded word $\overline{C}_s$ with check field $\tilde{M}_i$ of received word $\tilde{C}_y$. At this time, as shown in FIG. 4(e), a $C_1$ code check field $\hat{H}_i$ of the product code is recovered. Next, received word $\tilde{C}_p$ is decoded in a $C_1$ decoding routine (step ST15) to obtain an intermediate received word $\bar{I}_p$ as shown in FIG. 4(f). Intermediate received word $\bar{I}_p$ is decoded and information $I_p$ as shown in FIG. 4(g) is output in a $C_2$ decoding routine (step ST16).

In the case where first information $I_p$ is not superimposed by information obtained by encoding second information $I_s$, sufficient error-correcting capability cannot be exerted if error-correction encoding is not carried out by providing a wide check field because encoding is conducted with a code perfectly separating information $I_p$ and $I_s$.

Although the encoding and decoding explained with reference to FIGS. 2-4 can remarkably reduce redundancy of a product code if the code word of information $I_s$ is superimposed on the check field of the product code, the minimum distance of the superimposed code must be set as large as $d_1 \cdot d - 1$ in order to transmit information $I_s$, thereby necessitating complicated hardware.

Furthermore, in Kashara after internal check recovery symbol $\tilde{H}_i$ is generated, received word $\tilde{C}_s$ is separated from internal check recovery symbol $\tilde{H}_i$, and the product code must be recovered by adding decoded word $\overline{C}_s$ to received $\tilde{C}_y$.

Consequently very complicated processing is required to finally obtain information $I_p$ and $I_s$ as well as requiring a longer decoding time.

SUMMARY OF THE INVENTION

It is a general object of the present invention to solve the problems explained above.

It is another object of the present invention to provide an error-correction encoding and decoding system which can reduce any influence from pseudo-errors during superimposing separation and which is also capable of setting reliability of second information to a desired value independent of a reliability of first information.

It is a further object of the present invention to a superimposed code $U_s$ up to 2 times as high as a provide an error-correction encoding and decoding system which is capable of enhancing error-correcting capability of conventional decoding system and which can transmit second information, if it is transmitted with a reliability similar to that in the conventional decoding system, with a redundancy substantially equal to half of that in the conventional decoding system.

One aspect of the present invention provides an error-correction encoding and decoding system including an encoder to encode a first information of $k_1 \times k_2$ digits, having $k_1$ digits in a first direction, and $k_2$ digits in a second direction. The encoder encodes the first information along a first direction according to a first linear code having a check code of $(n_1 - k_1)$ digits and a minimum distance $d_1$. The encoder also encodes the first linear code, i.e., the first information coded along the first direction, along the second direction, according to a second linear code, having a check code of $(n_2 - k_2)$ digits and a minimum distance $d_2$. This encodes the first information to a product code word of $n_1 \times n_2$ digits. The encoder also encodes a second information of $r \times k_x$ digits (r being smaller than the number of digits of the check code in the first direction, and $k_x$ being smaller than the code length of the second linear code) to a third linear code of a minimum distance $d_3$. The encoder generates a composite code word by superimposing a code word of the third linear code on a field of the product code word having the check code of the fist direction of the product code word.

The invention also provides a decoder to receive a code word of the composite code as a received word. The decoder decodes the composite code along the first direction and outputs a received word of the third linear code. The decoder also decodes the second information from the received word of the output third linear code and decodes the first information from the output decoded in the first direction.

Another aspect of the present invention provides an error-correction encoding and decoding system including an encoder which encodes first information having $k_1$ digits in a first direction and $k_2$ digits in a second direction to a product code $C_A$ of $n_1 \times n_2$ digits. The product code $C_A$ has a partial code $C_1$ in the first direction being a linear $(n_1, k_1, d_1)$ code and has a partial code $C_2$ in the second direction being a linear $(n_2, k_2, d_2)$ code. Or, the encoder may encode a partial code $C_1$ to a code format $C_B$ crossing with $n_2$ steps in the second direction to encode second information of $r \times k_x$ $(r < n_1 - k_1, k_x < n_2)$ digits to a linear $(n_2, k_x, d_3)$ code so as to superimpose a code $U_s$ on a check symbol field of the product code $C_A$ or upon the code format $C_B$ in order to generate an error-correcting code $C_z$.

The system also includes a decoder for obtaining the second information, by recovering a superimposed received word $U_s$ by adding a flag to a symbol corresponding to the partial code word $C_1$. The flag utilizes decode information which indicates that correction is impossible by a syndrome of the decoder of the received partial code word $C_1$ or that reliability of correction is lowered so as to execute elimination/error decoding of the recovered superimposing received word $U_s$.

BRIEF DESCRIPTION OF DRAWINGS

FIG. 1 is a diagram indicating the structure of a conventional code word utilizing a product code and a block code;

FIG. 3 is a flowchart indicating a prior art decoding method;

FIG. 8 is a flowchart indicating a decoding method performed in the decoder of FIG. 7;

FIGS. 9a-d are diagrams for explaining a decoding operation of the decoder of FIG. 7.

DESCRIPTION OF PREFERRED EMBODIMENTS OF THE INVENTION

Figure 2:
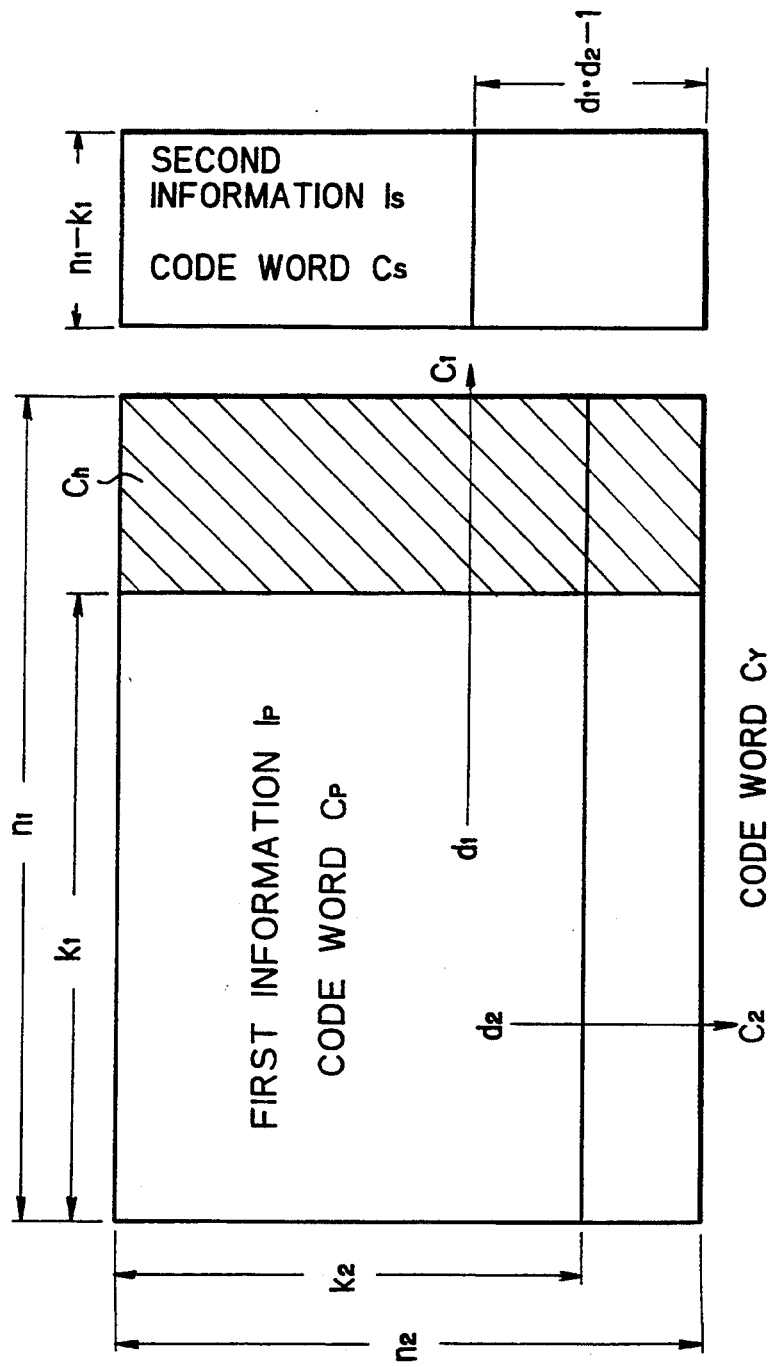
FIG. 2 is a structural diagram indicating the structure of a prior art code word utilizing a code superimposition.
Figure 4A:
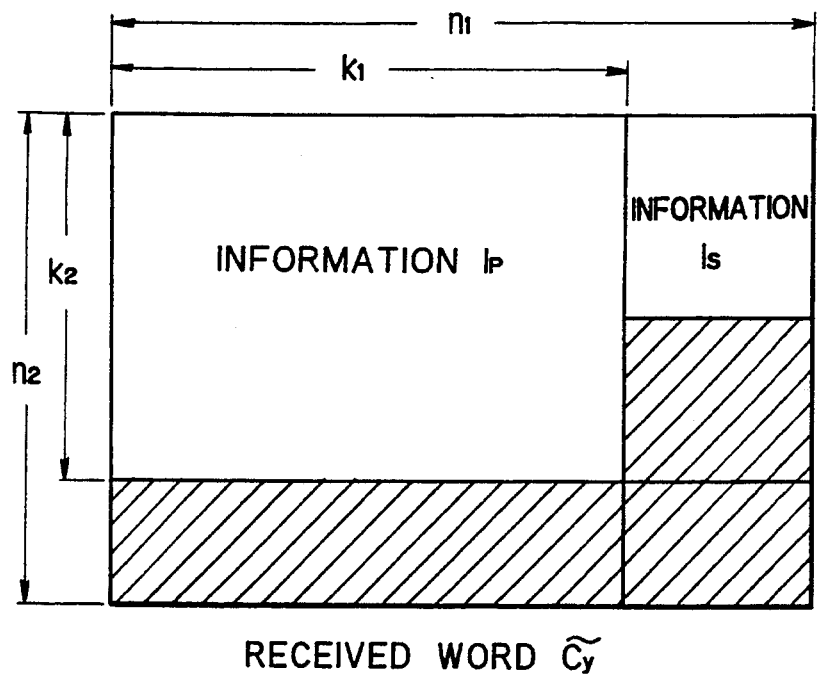
FIGS. 4a-g are diagrams for explaining a prior art decoding operation.
Figure 4B:
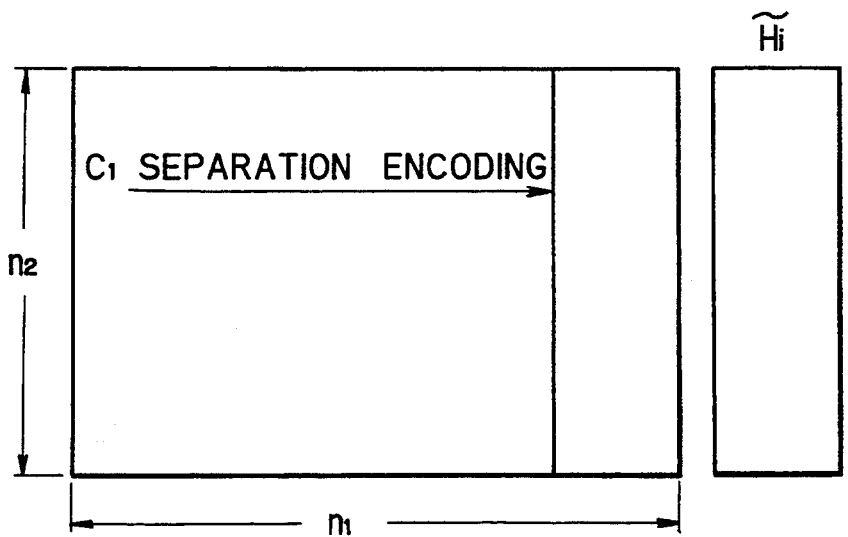
Figure 4C:
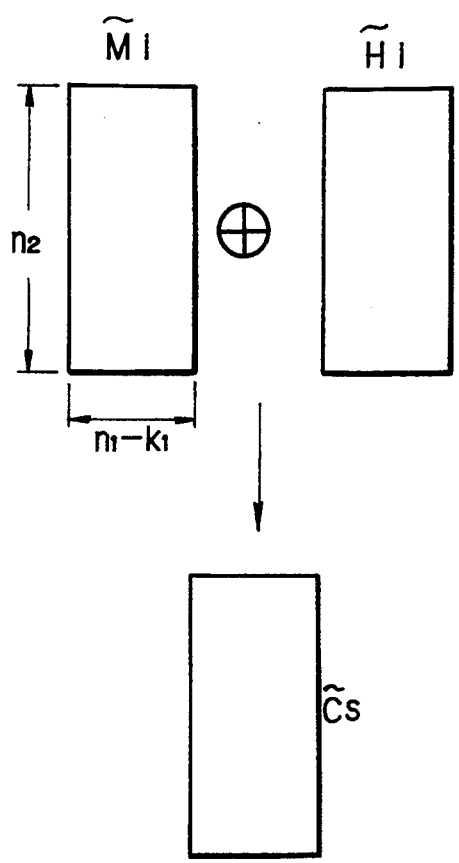
Figure 4D:
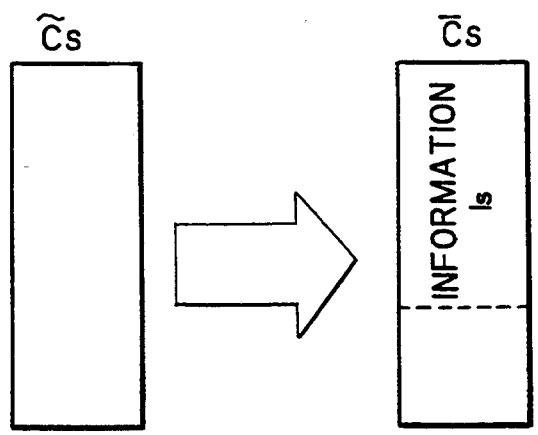
Figure 4E:
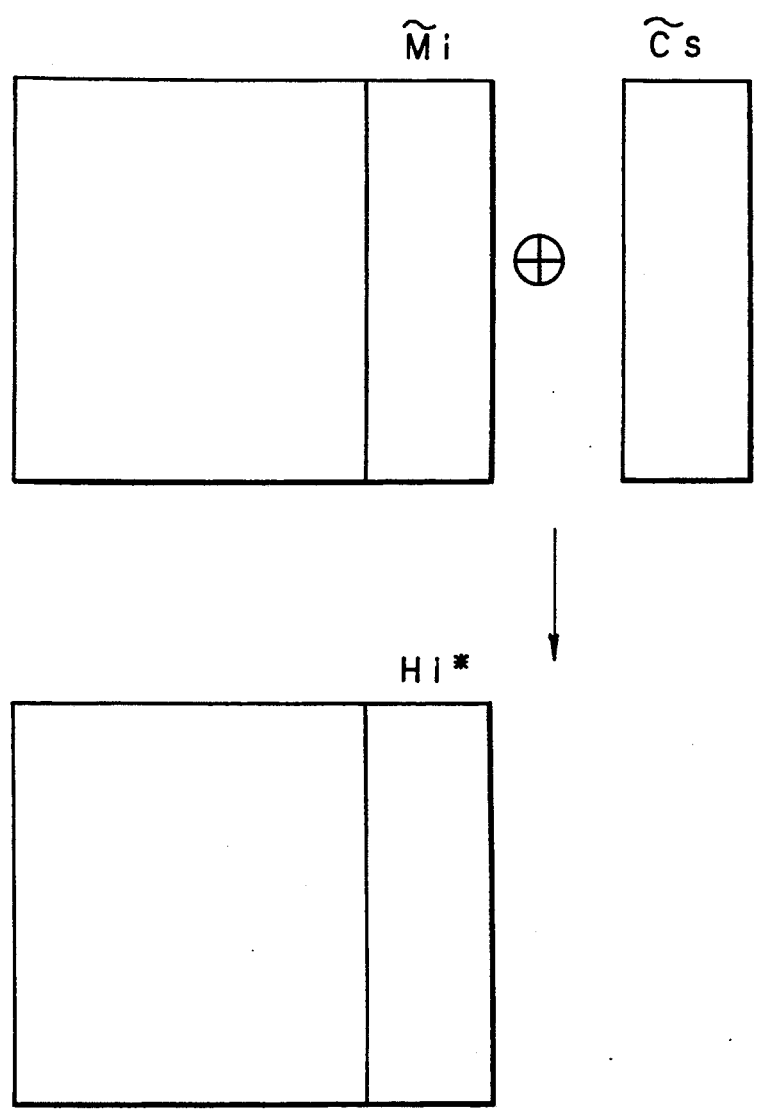
Figure 4F:
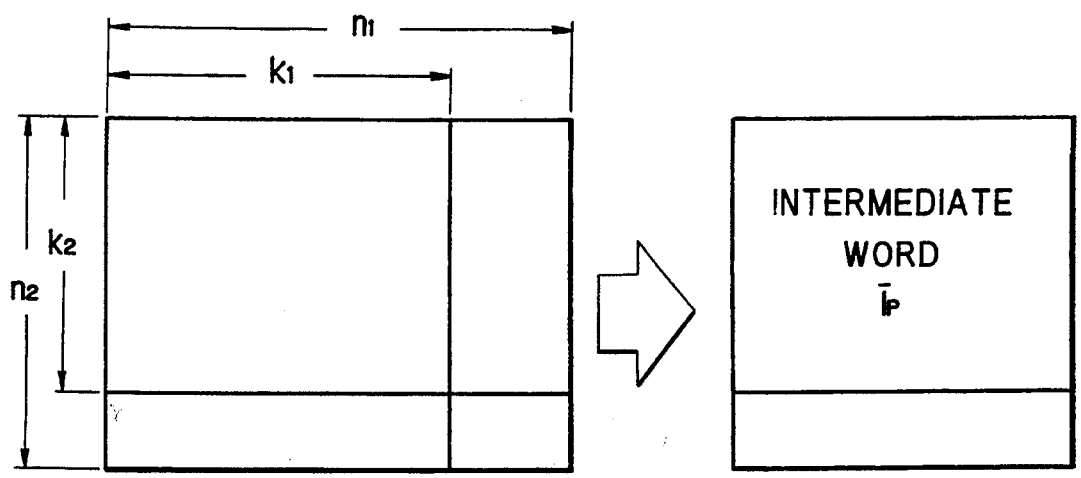
Figure 4G:
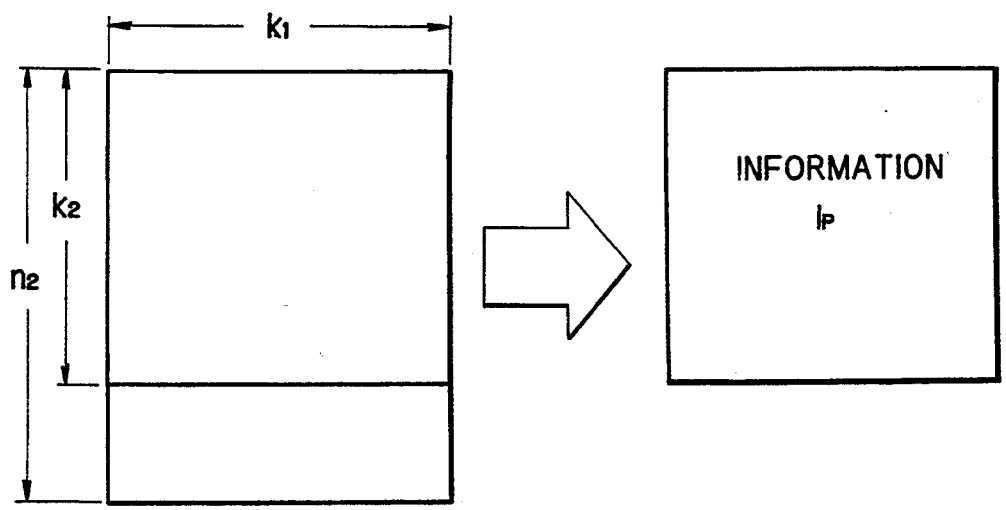
Figure 5:
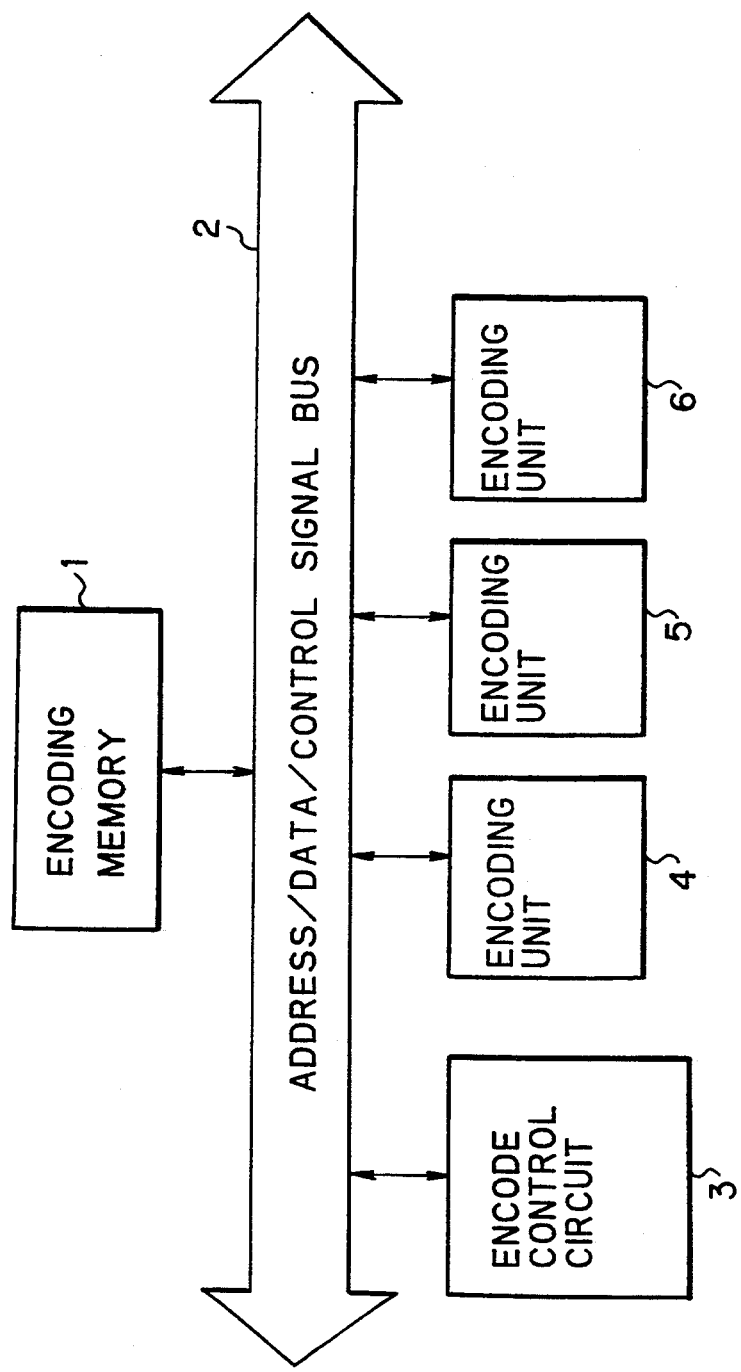
FIG. 5 is a block diagram indicating the structure of an encoder to be used for an error-correction encoding and decoding system according to an embodiment of the present invention.

Some embodiments of the present invention will be explained hereunder. FIG. 5 is a block diagram indicating the structure of an embodiment of an encoder 10 for realizing an error-correction encoding and decoding system according to the present invention. In this figure, reference numeral 1 denotes an encoding memory for storing information $I_p$ (first information) and information $I_s$ (second information). Reference numeral 2 denotes an address/data/control signal bus (hereinafter referred to as "bus"). Reference numeral 3 denotes an encode control circuit. Reference 4 denotes a $C_1$ encoding unit (first encoding unit) for performing the encoding in the row direction (first direction). Reference numeral 5 denotes a $C_2$ encoding unit (second encoding unit) for performing the encoding in the column direction (second direction). Reference number 6 denotes a $C_3$ encoding unit (third encoding unit) for encoding a superimposed code (third linear code).

It is assumed that the first information $I_p$ has $k_1 \times k_2$ digits, and that the second information $I_s$ has $r \times k_x$ digits (where $r < n_1 - k_1$ and $k_x < n_2$).

Next, an operation of the encoder shown in FIG. 5 will be explained. Information $I_p$ of $k_1 \times k_2$ digits, stored in encoding memory 1, is received by $C_1$ encoding unit 4 in sets of $k_1$ digits, under the control of encode control circuit 3. The encoding is carried out for each input digit and a code word of $n_1$ digits is generated. This processing is repeated $k_2$ times, once for each row of $I_p$. An intermediate code word of $k_2 \times n_1$ digits is thus generated. The intermediate code word is received by $C_2$ encoding unit 5 in sets of $k_2$ digits, i.e., each of the n columns, under the control of encode control circuit 3. Encoding is carried out for each input digit to generate a code word of $n_2$ digits. The processing is repeated $n_1$ times to generate a code word of a product code $C_A$ of $n_1 \times n_2$ digits.

Figure 6:
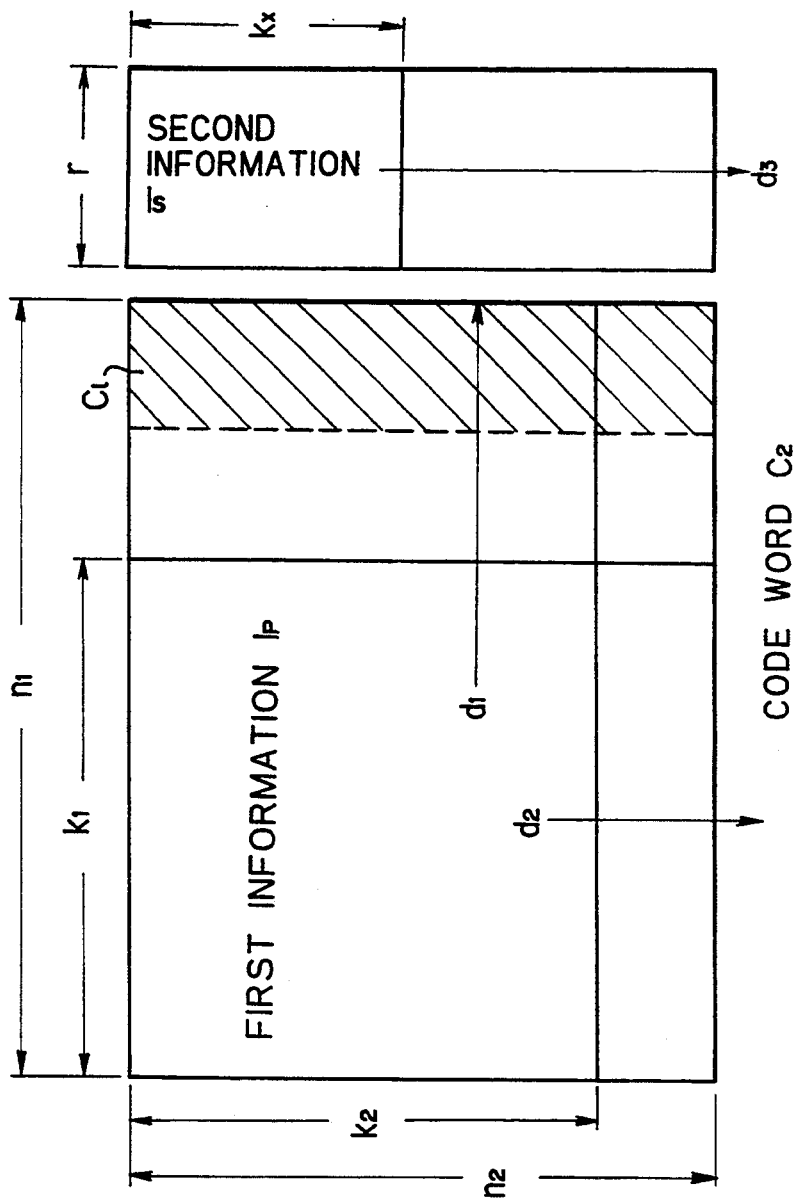
FIG. 6 is a diagram indicating an example of the structure of a code word according to an embodiment of the invention.

Meanwhile, information $I_s$ of $r \times k_x$ digits, stored in encoding memory 1, is encoded by $C_3$ encoding unit 6 according to a ($n_2$, $k_x$, $d_3$) linear code (i.e., superimposed code $U_s$) to generate a code word $C_s$. A code word $C_s$ of superimposed code $U_s$ is superimposed on a part $C_l$ (hatched portion in FIG. 6) in the row direction of the corresponding code word of the product code through bus 2, under the control of encode control circuit 3. Finally, an error-correcting code word $C_z$ is generated. The structure of error-correcting code word $C_z$ is shown in FIG. 6.

Figure 7:
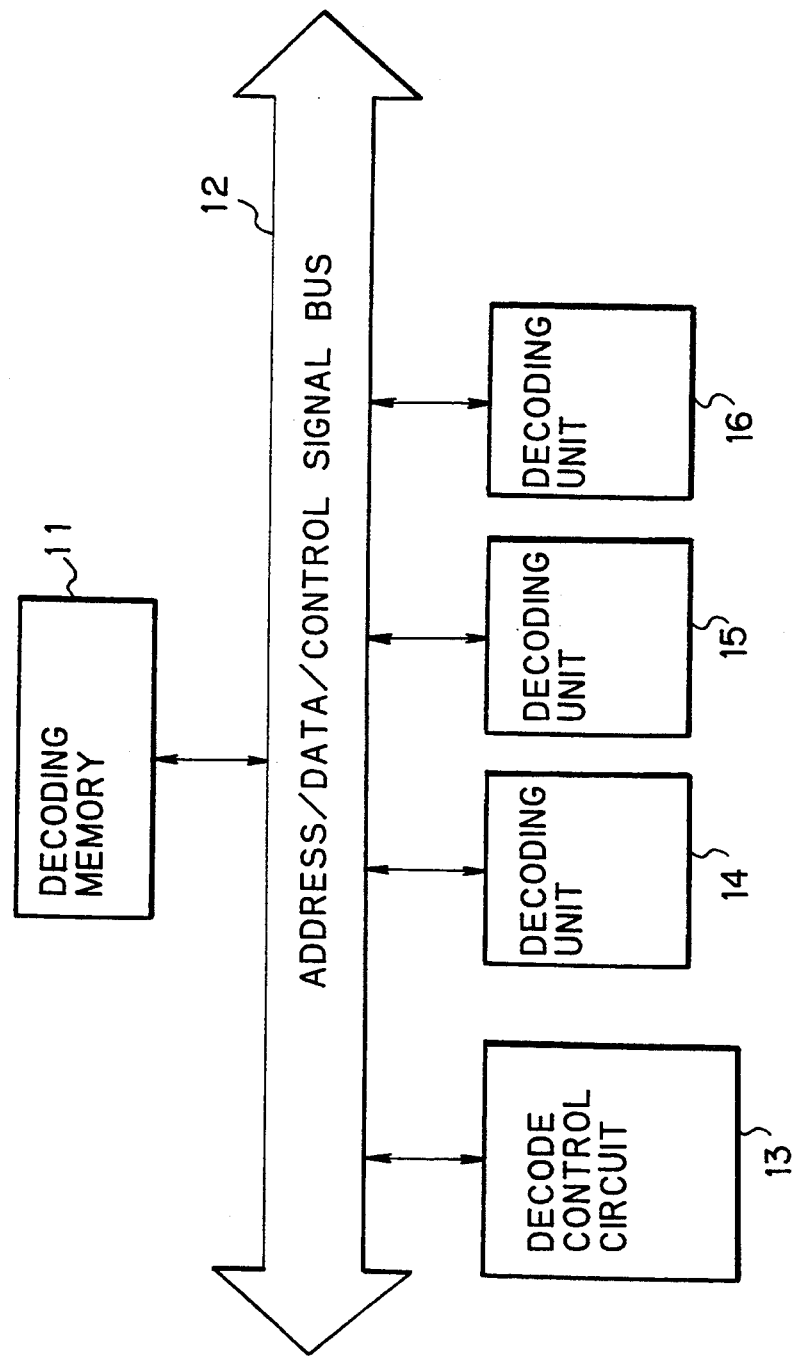
FIG. 7 is a block diagram indicating the structure of a decoder for an error-correcting code encoded by the encoder of FIG. 5.

FIG. 7 is a block diagram indicating the structure of an embodiment of a decoder 20 for decoding a received code word $\widetilde{C_z}$, encoded by the encoder of FIG. 5. In FIG. 7, the reference numeral 11 denotes a decoding memory for recovering a received word. Reference numeral 12 denotes an address/data/control signal bus. Reference numeral 13 denotes a decode control circuit for controlling each unit through address/data/control signal bus 12 so as to execute a decoding operation. Reference numeral 14 denotes a $C_1$ decoding unit for decoding a received word $\widetilde{C_1}$ which is a partial code word of received product code $\widetilde{C_A}$. Reference number 15 denotes a $C_2$ decoding unit for decoding a received word $\widetilde{C_2}$. Reference numeral 16 denotes a $C_3$ decoding unit for executing elimination/error decoding of superimposed received word $\widetilde{C_3}$, after superimposing and separating superimposed received word $\widetilde{C_3}$ from the superimposing field of received code $\widetilde{C_z}$, stored in decoding memory 11. An operation of the decoder 20 shown in FIG. 7 will be explained with reference to a flowchart of FIG. 8 and the explanatory diagrams of FIG. 9a–d. A received word $\widetilde{C_z}$ of $n_1 \times n_2$ digits, received from the transmission line and stored in decoding memory 11, is input to $C_1$ decoding unit 14 by a command of decode control circuit 13. The structure of received word $\widetilde{C_z}$ is shown in FIG. 9(a). $C_1$ decoding unit 14 considers a field of $r \times n_2$ digits on which a code $U_s$ is superimposed as an elimination pattern, and received word $\widetilde{C_z}$ is decoded along each of the $n_2$ rows (step ST21). Namely, decoding is carried out for each of $n_2$ rows. At this time, r superimposed symbols are considered as eliminated symbols. As such, t errors and r eliminations are corrected in the range where $2t + r < d_1$. As a result of this correction, when $n_2$ received words in the row direction have been decoded, a recovered elimination error pattern becomes a received word $\widetilde{C_s}$ corresponding to code word $C_s$ of superimposed code $U_s$. That is, $\widetilde{C_s}$ equals $C_s$ plus transmission line error. Received word $\widetilde{C_s}$ is superimposed and separated from received code $\widetilde{C_z}$ (refer to FIG. 9(b)).

Next, received word $\widetilde{C_s}$ is decoded by $C_3$ decoding unit 16 (step ST22) to output information $I_s$ (refer to FIG. 9(c)). Also, $C_2$ decoding unit 15 repeatedly decodes the information decoded by $C_1$ decoding unit 14, $n_1$ times (step ST23), i.e., for each column, thereby completing the decoding of the product code and outputs information $I_p$ (refer to FIG. 9(d)).

In the above embodiment, an example has been explained where a code word of a superimposed code is superimposed on the check symbol field of the codes in the row direction of the product code. However, a similar advantage can also be obtained by superimposing such a code word on the check symbol field of the codes in the column direction.

As will be understood from the above explanation, the present invention is advantageous in that, since an encoder for an error-correcting code is structured to superimpose a code word of a superimposed code only on a part of the check symbol field of a product code, an error correcting capability of the superimposed code can be arbitrarily set and a received word of the superimposed code can simultaneously be recovered in a decoding side at the time of decoding the product code in one direction.

Moreover, the present invention is advantageous in that, since the decoder is structured to receive a code word made having a superimposed code word only on a part of the check symbol field of the product code, so as to recover a received word of the superimposed code at the time of decoding the product code in one direction, any influence of pseudo-error can be prevented without any necessity of superimposing and separating the product code and the superimposed code. Thus, high speed decoding can be achieved.

The present invention is further advantageous in that, a code word of a superimposed code is decoded as eliminated digits. Thus, a received word of the superimposed code can be simultaneously recovered, high speed decoding can be achieved, and any restriction to the error-correcting capability of a superimposed code can be removed.

Figure 10:
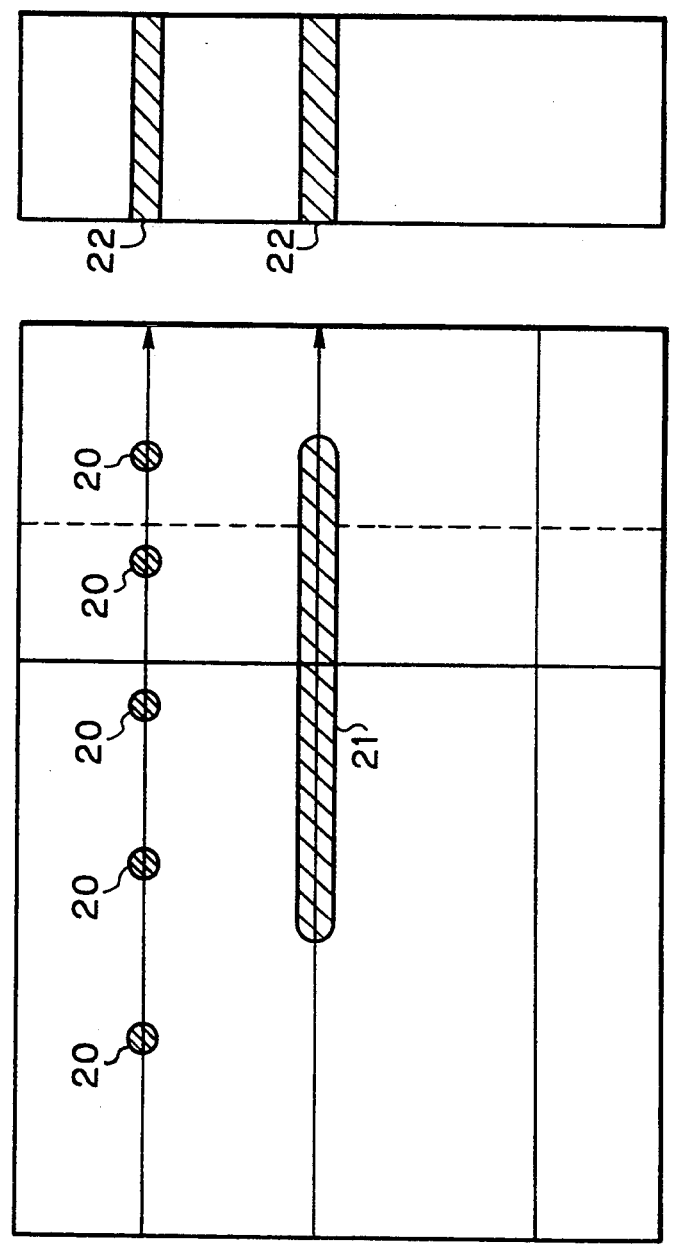
FIG. 10 is a diagram for explaining operations of an improved error-correction encoding and decoding system of the present invention.

In the error-correction decoding system explained with reference to FIG. 7–FIG. 9(d), correct second information $I_s$ can be obtained as long as superimposed code $U_s$ has sufficient error-correcting capability. Namely, recovered superimposed received word $C_s$ can be obtained as an elimination pattern in decoding received word $\widetilde{C_1}$, but the obtained elimination pattern is a result obtained by modulo-2 summing superimposed code $U_s$ with errors generated on this superimposed code $U_s$. Therefore, if decoding of received word $\widetilde{C_1}$ is not carried out correctly, an elimination pattern cannot be recovered correctly, resulting in an error (not elimination but pure error) of recovered superimposed received word $C_s$. However, as shown, for example, in FIG. 10, in the case where random error 20 and burst error 21 exceed the correcting capability of received word $\widetilde{C_1}$ are generated, an elimination flag 22 is output with respect to superimposed received word $\widetilde{C_s}$ when it is judged that correction is impossible by a syndrome of $C_1$ decoding unit 14 or when correction is possible but reliability is low. Superimposed received word $C_s$ thus recovered is corrected as an elimination symbol by $\widetilde{C_3}$ decoding unit, because no symbol is recovered at the point where elimination flag 22 is set. Such operations as described above are carried out based on instructions of decode control circuit 13.

Assuming that the minimum distance of superimposed code $U_s$ is D, that S eliminations are generated by decoding received word $C_1$ and that recovered superimposed received code $\bar{C}_s$ includes $n_e$ error symbols due to error correction of received word $C_1$ or overlooked error, $n_e$ errors and S eliminations can be corrected in the range where $2n_e+S<D$. When all errors in decoding received word $C_1$ can successfully be corrected (namely $n_e=0$), S becomes equal to (D−1) indicating that error correction as high as 2-fold of that in the ordinary correction can be realized.

In an embodiment of the present invention, the first information of $k_1 \times k_2$ digits is converted to a linear code of $(n_2-k_2)$ digits in the second direction with the minimum distance $d_2$, but it is possible to construct an encoder which generates a composite code by linearly encoding the second information of $r \times k_x$ digits in the second direction for superimposition and a decoder which decodes the first and second information from the received word encoded by the encoder, if the first information is comprised of $K_1 \times n_2$ digits and no linear encoding is performed in the second direction.

As explained above, an elimination flag is added to a relevant symbol of a corresponding superimposed received word $C_s$ by utilizing decoding information of a received word $C_1$, and elimination error decoding is conducted on a recovered superimposed received word $C_s$. Accordingly, the error-correcting capability of an error-correcting code $U_s$ of a superimposed code $U_s$ can be enhanced up to 2 times in comparison with that of a conventional decoding system. Further, in the case of transmission of information having a reliability similar to that of the conventional system, an error-correction decoding system which can transmit the second information with a redundancy of about half of that in the conventional decoding system can be realized.

What is claimed is:

1. An error-correction encoding and decoding system for encoding and decoding first information of $k_1 \times k_2$ digits having $k_1$ digits in a first direction and $k_2$ digits in a second direction and for encoding and decoding second information of $r \times k_x$ digits, comprising:

means for encoding the first information along the first direction, according to a first linear code having a code length $n_1$, a check symbol of $(n_1-k_1)$ digits, and a minimum distance $d_1$ to form coded first information, means for encoding the coded first information along the second direction according to a second linear code having a code length $n_2$, a check symbol of $(n_2-k_2)$ digits and a minimum distance $d_2$ to form a product code word of $n_1 \times n_2$ digits, means for encoding the second information of $r \times k_x$ digits ($r<n_1-k_1$ and $k_x<n_2$) according to a third linear code of a minimum distance $d_3$ so as to form a code word of coded second information, means for generating a composite code word by superimposing the code word of coded second information on a field of the product code having the check symbol of the first direction of the product code;

means for transmitting the composite code word, means for receiving the transmitted composite code word, as a received composite code word, means for decoding the received composite code word along the first direction including means for eliminating the field so as to output a received product code word and including means for producing a received code word of coded second information, means for decoding the received code word of coded second information to output the second information, and means for decoding the received product code word so as to output the first information.

2. The error-correction encoding and decoding system according to claim 1, wherein the system further comprises a memory and a bus, and wherein the means for encoding the first information comprises a first encoding unit connected to the memory via the bus and wherein the means for encoding the first coded information comprises a second encoding unit connected to the memory via the bus, and wherein the means for encoding the second information comprises a third encoding unit connected to the memory via the bus; and wherein the means for generating further comprises an encode control circuit for controlling the first, second, and third encoding units and the bus so as to superimpose the code word of coded second information upon the product code.

3. The error-correction encoding and decoding system according to claim 1, wherein the system further comprises a decode memory and a decode bus, and wherein the means for receiving includes means for storing the received composite code word in the decode memory, and wherein the means for decoding the received composite code word comprises a first decoding unit connected to the decode memory via the decode bus; and wherein the means for decoding the received code word of the coded second information comprises a third decoding unit connected to the decode memory via the decode bus; and wherein the means for decoding the received product code word comprises a second decoding unit.

4. A method for decoding a received composite code word, the received composite code word including a product code word having a first direction coded by a first code and a second direction coded by a second code, the received composite code word further including a superimposed code word coded by a third code, the superimposed code word being superimposed on digits of the product code word, the method comprising the steps of:

decoding the received composite code word along the first direction such that the digits on which the superimposed code word is superimposed are eliminated in order to recover a first code word corresponding to the first direction of the product code word and in order to recover a second code word corresponding to the superimposed code word; and decoding the first code word along the second direction in accordance with the second code so as to recover first information of the product code word; and decoding the second code word in accordance with the third code so as to recover the superimposed code word.

5. An error-correction encoding and decoding system for encoding and decoding first information of $k_1 \times n_2$ digits having $k_1$ digits in a first direction and $n_2$ digits in a second direction and for encoding and decoding second information of $r \times k_x$ digits, comprising:

means for encoding the first information along the first direction, according to a first linear code having a code length $n_1$, a check symbol of $(n_1 - k_1)$ digits and a minimum distance $d_1$ to form coded first information, means for encoding the second information of $r \times k_x$ digits ($r < n_1 - k_1$, $k_x < n_2$) according to a third linear code of a minimum distance $d_3$ to form a code word of coded second information, means for generating a composite code word by superimposing the code word of coded second information on a field of the first coded information, means for transmitting the composite code word, means for receiving the transmitted composite code word, as a received composite code word, means for decoding the received composite code word along the first direction so as to output a received code word of coded second information and a received code word of coded first information, means for decoding the received code word of coded second information so as to output the second information, and means for decoding the received code word of coded first information so as to output the first information.

6. The system of claim 1 wherein the means for decoding the received composite code word includes means for outputting an indicative flag when the received composite code word contains a predetermined number of errors along the first direction.

* * * * *